(12) United States Patent
Halimaoui et al.

(10) Patent No.: US 8,178,426 B2
(45) Date of Patent: May 15, 2012

(54) METHOD FOR MANUFACTURING A STRUCTURE OF SEMICONDUCTOR-ON-INSULATOR TYPE

(75) Inventors: Aomar Halimaoui, La Terasse (FR); Yves Morand, Grenoble (FR); Yves Campidelli, Grenoble (FR); Olivier Kermarrec, Gieres (FR)

(73) Assignees: STMicroelectronics S.A., Montrouge (FR); STMicroelectronics (Crolles 2) SAS, Crolles (FR)

( * ) Notice: Subject to any disclaimer, the term of this patent is extended or adjusted under 35 U.S.C. 154(b) by 441 days.

(21) Appl. No.: 12/031,202

(22) Filed: Feb. 14, 2008

(65) Prior Publication Data

US 2008/0197447 A1 Aug. 21, 2008

(30) Foreign Application Priority Data

Feb. 15, 2007 (FR) ...................... 07 53287

(51) Int. Cl.
*H01L 21/20* (2006.01)
(52) U.S. Cl. .... 438/479; 438/458; 257/347; 257/E21.57
(58) Field of Classification Search .................. 438/455, 438/458, 478, 479
See application file for complete search history.

(56) References Cited

U.S. PATENT DOCUMENTS

| | | | | |
|---|---|---|---|---|
| 4,872,947 A * | 10/1989 | Wang et al. | ...................... | 216/38 |
| 6,376,859 B1 * | 4/2002 | Swanson et al. | ................ | 257/49 |
| 7,071,051 B1 * | 7/2006 | Jeon et al. | ...................... | 438/216 |
| 2002/0135048 A1 * | 9/2002 | Ahn et al. | ...................... | 257/632 |
| 2004/0058511 A1 * | 3/2004 | Sakaguchi | .................... | 438/458 |
| 2004/0245571 A1 * | 12/2004 | Cheng et al. | ................. | 257/347 |

FOREIGN PATENT DOCUMENTS

WO WO 2004/007304 A2 8/2004

OTHER PUBLICATIONS

"Deposit." Oxford English Dictionary Online. 1989. Nov. 24, 2010 <http://dictionary.oed.com/cgi/entry/50061276?query_type=word &queryword=deposit&first=1&max_to_show=10&sort_type=alpha&result_place=2&search_id=C0Mg-NFQRWX-6041 &hilite=50061276>.*
Adamyan et al., Determination of basic parameters of porous silicon, Aug. 4, 2006, Institute of Physics Publishing, Journal of Physics D: Applied Physics, pp. 3543-3546.*
French Search Report from corresponding French Application No. 0753287, filed Feb. 15, 2007.

* cited by examiner

*Primary Examiner* — Charles Garber
*Assistant Examiner* — Reema Patel
(74) *Attorney, Agent, or Firm* — Wolf, Greenfield & Sacks, P.C.

(57) ABSTRACT

A method for manufacturing an insulated semiconductor layer, including: forming a porous silicon layer on a single-crystal silicon surface; depositing an insulating material so that it penetrates into the pores of the porous silicon layer; eliminating the insulating material to expose the upper surface of the porous silicon; and growing by epitaxy a semiconductor layer.

27 Claims, 2 Drawing Sheets

METHOD FOR MANUFACTURING A STRUCTURE OF SEMICONDUCTOR-ON-INSULATOR TYPE

BACKGROUND OF THE INVENTION

1. Field of the Invention

The present invention generally relates to semiconductor components, and more specifically to a method for manufacturing a substrate of semiconductor-on-insulator type. The present invention also relates to the structure obtained by this method.

2. Discussion of the Related Art

Various methods for manufacturing silicon-on-insulator type structures (SOI) are known.

A first method comprises using two silicon wafers, one of which has an oxidized surface, and gluing them so that the oxidized surface is located between the two wafers. An etching or any other chemical or mechanical operation is then performed to decrease the surface of a wafer and thus obtained the desired SOI structure. This method is relatively reliable, but it is limited by the fact that it only enables forming full-plate SOI structures.

Another method comprises creating, on a single-crystal silicon wafer, an insulator layer provided with an opening. A silicon epitaxy is then performed on this system and enables forming, at the level of the opening, a single-crystal silicon portion and, on the insulator layer, a polysilicon layer. A recrystallization step turns the entire layer into single-crystal silicon. This method enables positioning of SOI areas on a silicon wafer but is not very reliable and does not enable obtaining extended SOI areas.

SUMMARY OF THE INVENTION

At least one embodiment of the present invention aims at providing a method for obtaining a structure of semiconductor-on-insulator type on a silicon support. This method further enables positioning the semiconductor-on-insulator type structure on the support.

To achieve all or part of these objects, as well as others, an embodiment of the present invention provides a method for manufacturing an insulated semiconductor layer, comprising: forming a porous silicon layer on a single-crystal silicon surface; depositing an insulating material so that it penetrates into the pores of the porous silicon layer; eliminating the insulating material to expose the upper surface of the porous silicon; and growing by epitaxy a semiconductor layer.

According to an embodiment of the present invention, the material of the semiconductor layer is selected from the group comprising silicon, germanium, and silicon-germanium.

According to an embodiment of the present invention, the porous silicon layer is formed by electrochemical etching of the single-crystal silicon surface.

According to an embodiment of the present invention, the insulating material is $HfO_2$ or another insulator that can be deposited by a so-called ALD (Atomic Layer Deposition) deposition method.

An embodiment of the present invention provides a structure of semiconductor-on-insulator type comprising a semiconductor layer resting on a porous silicon layer having pores filled with an insulating material, the porous silicon layer resting on single-crystal silicon.

According to an embodiment of the present invention, the material of the semiconductor layer is selected from the group comprising silicon, germanium, and silicon-germanium.

According to an embodiment of the present invention, the insulating material is $HfO_2$.

An embodiment of the present invention also relates to a structure of semiconductor-on-insulator type formed at at least one location of a silicon wafer.

The foregoing and other objects, features, and advantages of the present invention will be discussed in detail in the following non-limiting description of specific embodiments in connection with the accompanying drawings.

DETAILED DESCRIPTION

Figure 1A:
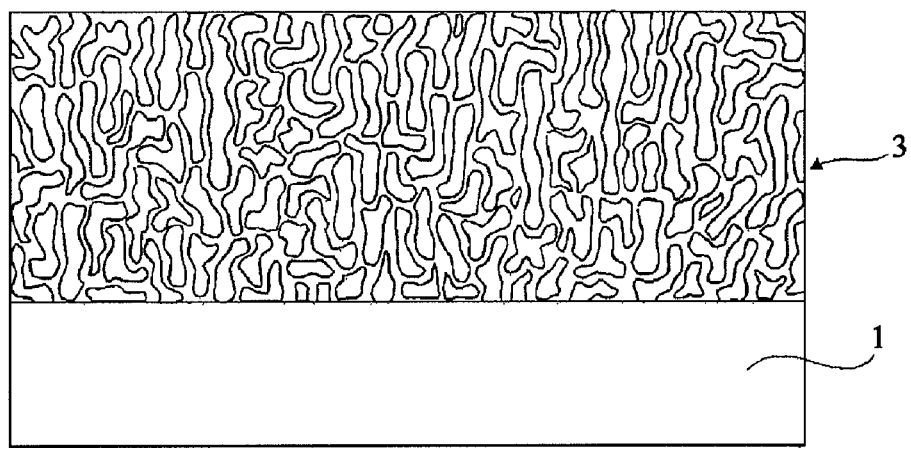
FIGS. 1A to 1D show the results of steps of a method according to an embodiment of the present invention for manufacturing a semiconductor-on-insulator structure.

For clarity, the same elements have been designated with the same reference numerals in the different drawings and, further, as usual in the representation of semiconductor components, the various drawings are not drawn to scale.

FIG. 1A shows a silicon wafer 1, the upper surface of which has been at least locally turned into porous silicon 3 by any known method, for example, by electrolysis in the presence of an acid solution.

Figure 1B:
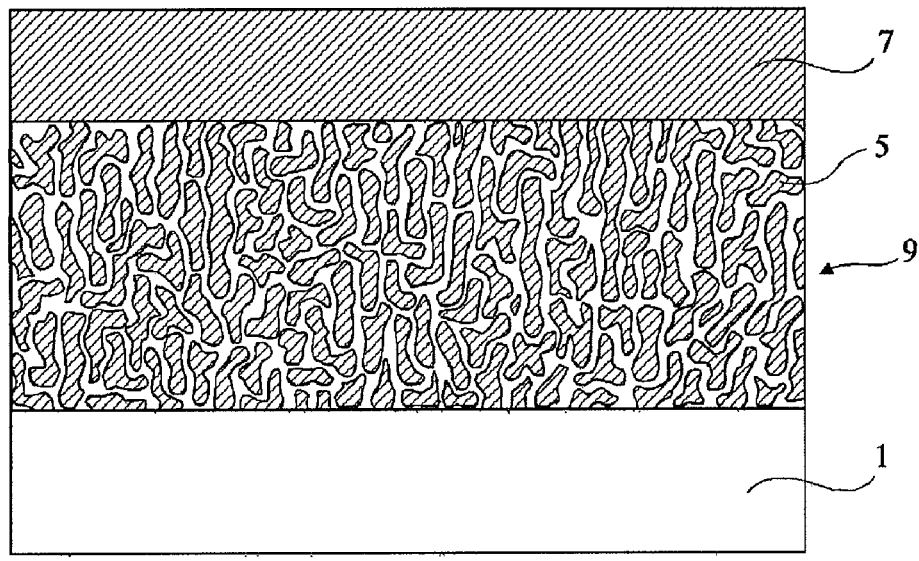

At the step of FIG. 1B, a deposition of an insulating material by a method currently designated in the art as ALD has been performed on the structure of FIG. 1A. In this step, the pores of the porous silicon are filled with insulating material 5 and insulating material deposits in a layer 7 above the structure. Such methods preferably imply a step, at least initial, of surface oxidation of the porous silicon. As an example, the insulating material may be hafnium dioxide $HfO_2$ obtained by an alternation of cycles in a $HfCl_4$ atmosphere and in a $H_2O$ atmosphere. Due to the filling of the pores of insulating porous silicon 3 with insulating material 5, the insulating character of the obtained layer 9 significantly increases.

Figure 1C:
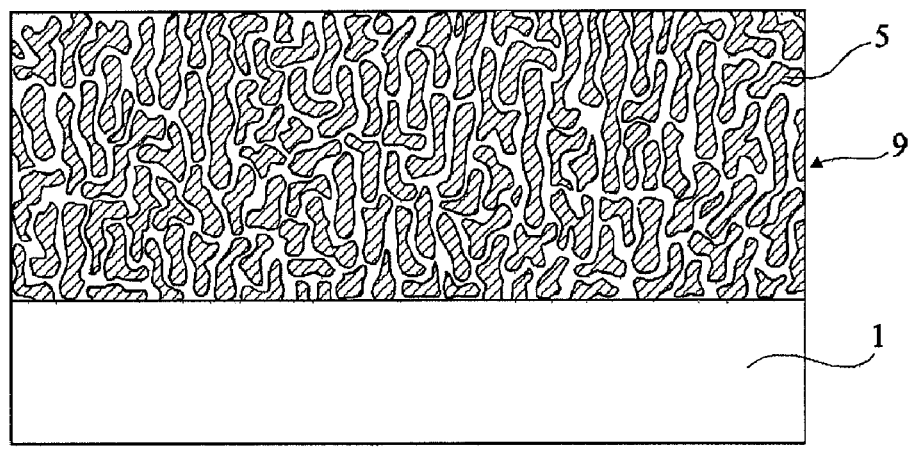

At the step of FIG. 1C, a withdrawal of insulating material layer 7 located above layer 9 has been performed. This withdrawal enables exposing the upper surface of the grains of porous silicon layer 9, the pores of which have been filled with insulating material 5. As an example, the withdrawal may be carried out by chemical etch or by a CMP (chem.-mech. polishing) method, or by a combination of the two operations.

Figure 1D:
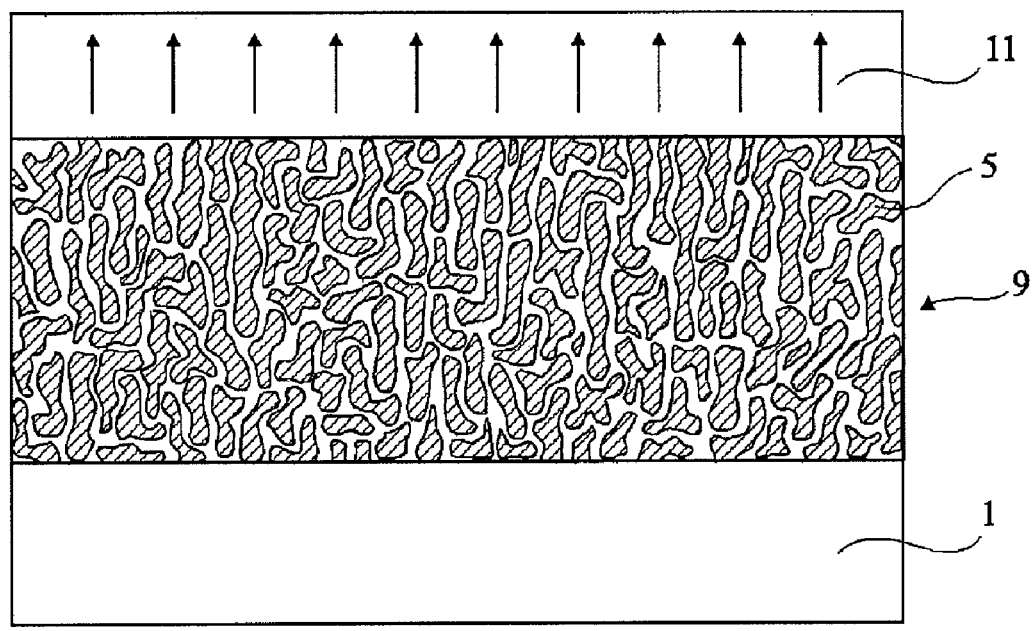

At the step of FIG. 1D, an epitaxial growth of a semiconductor layer 11 has been carried out on the structure of FIG. 1C. This growth is possible since the crystallographic information of silicon 1 is kept in the porous silicon grains of layer 9. As an example, semiconductor layer 11 may be a silicon, germanium, or silicon-germanium layer.

A structure of semiconductor-on-insulator type has thus been obtained by this method, the insulator being porous silicon layer 9, the pores of which are filled with insulator 5.

Figure 2:
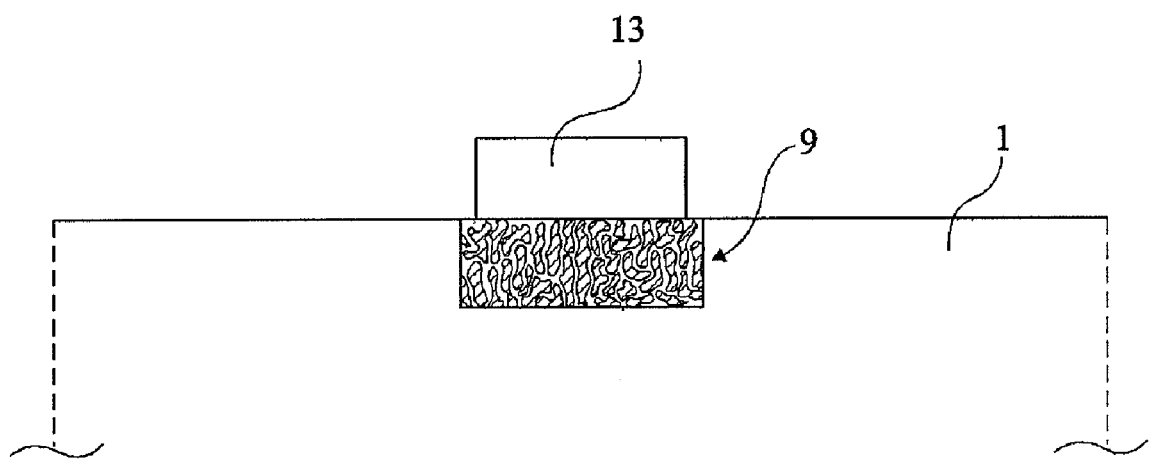
FIG. 2 shows a portion of a silicon wafer comprising a localized area of semiconductor-on-insulator type, according to an embodiment of the present invention.

FIG. 2 illustrates a portion of a silicon wafer 1 on which an area 13 of semiconductor-on-insulator type according to an embodiment of the present invention has been formed. Indeed, the method of the present invention has the advantage of enabling, by an adapted masking system, to perform the operations described in relation with FIGS. 1A to 1D on selected areas of a silicon wafer 1 only.

Specific embodiments of the present invention have been described. Various alterations and modifications will occur to those skilled in the art. In particular, insulating material 5, 7 has been described as being $HfO_2$. As a variation, this insulating material may be any insulating material capable of being deposited by an ALD method or another method enabling filling of the pores of a porous silicon layer, for example, various chemical vapor depositions (CVD) methods, possibly plasma-assisted, used under low-kinetics conditions.

The manufacturing method according to an embodiment of the present invention has several advantages over known methods:
- this method enables, as described in relation with FIG. 2, positioning a structure of semiconductor-on-insulator type on a silicon wafer;
- this method enables creating, on the same wafer, silicon, silicon-on-insulator, germanium-on-insulator, silicon-germanium-on-insulator areas . . . ;
- this method also provides an insulator which is very stable at high temperatures. Indeed, the association of porous silicon with an insulating material of hafnium dioxide type $HfO_2$ forms a material resistant to high temperatures. Further, this material has the property of not being consumed in acids, that is, the use of methods involving acids is possible to form components from the structure of FIG. 2D;
- semiconductor layer 11 is obtained by epitaxy, which is a well-controlled method. The method of the present invention thus enables forming structures of semiconductor-on-insulator type provided with a semiconductor layer of controlled thickness.

As an example of numerical values, the method for manufacturing a structure of semiconductor-on-insulator type of the present invention provides a porous silicon layer 9 approximately 500-nm deep and having pores with dimensions of approximately 5 nm.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing an insulated semiconductor layer, comprising:
   forming a porous silicon layer on a single-crystal silicon surface;
   depositing an insulating material different than silicon dioxide so that it penetrates into pores of the porous silicon layer;
   removing at least some of the insulating material to expose at least one portion of the upper surface of the porous silicon; and
   growing by epitaxy a semiconductor layer on the at least one portion of the upper surface of the porous silicon.

2. The method of claim 1, wherein a material of the semiconductor layer is selected from a group consisting of silicon, germanium, and silicon-germanium.

3. The method of claim 1, wherein the porous silicon layer is formed by electrochemical etching of the single-crystal silicon surface.

4. The method of claim 1, wherein the insulating material is deposited by an ALD (Atomic Layer Deposition).

5. The method of claim 1, where the porous silicon layer has a depth of approximately 500 nm.

6. The method of claim 1, wherein the insulating material comprises $HfO_2$.

7. A structure of semiconductor-on-insulator type comprising:
   a semiconductor layer disposed on a porous silicon layer having pores filled with hafnium dioxide insulating material, the porous silicon layer disposed on single-crystal silicon.

8. The structure of claim 7, wherein a material of the semiconductor layer is selected from a group consisting of silicon, germanium, and silicon-germanium.

9. The structure of claim 7, wherein the insulating material comprises at least one material different from an oxide of the porous silicon layer.

10. The structure of semiconductor-on-insulator type of claim 7 formed at least at one selected location of a silicon wafer.

11. The structure of claim 7, wherein the pores have dimensions of approximately 5 nm.

12. The structure of claim 7, wherein the porous silicon layer has a depth of approximately 500 nm.

13. A structure of semiconductor-on-insulator type comprising:
   a first porous semiconductor layer disposed on single-crystal semiconductor, the first porous semiconductor layer having pores with a non-native insulator deposited therein that increases an insulating characteristic of the first porous semiconductor layer; and
   a second semiconductor layer disposed on a surface of the first porous semiconductor layer.

14. The structure of claim 13, wherein the first porous semiconductor layer is a porous silicon layer and the single-crystal semiconductor is single-crystal silicon.

15. The structure of claim 14 formed at least at one selected region of a silicon wafer.

16. The structure of claim 14, wherein the porous silicon layer having pores filled with the non-native insulator is heat resistant.

17. The structure of claim 14, wherein the porous silicon layer having pores filled with the non-native insulator is acid resistant.

18. The structure of claim 13, wherein the non-native insulator comprises at least one material different from an oxide of the first porous semiconductor layer.

19. A method for manufacturing an insulated semiconductor layer, comprising:
   depositing a non-native insulator into pores of a first porous semiconductor layer; and
   forming a second semiconductor layer on and in contact with the first porous semiconductor layer and the non-native insulator.

20. The method of claim 19, wherein the first porous semiconductor layer is a porous silicon layer.

21. The method of claim 19, wherein the insulator is capable of being deposited by an ALD (Atomic Layer Deposition) deposition method.

22. The method of claim 19, wherein the insulator is capable of being deposited by a plasma-assisted deposition method under low-kinetics conditions.

23. The method of claim 19, wherein the insulator is capable of being deposited by a CVD (Chemical Vapor Deposition) deposition method.

24. The method of claim 20, wherein the porous silicon layer is formed by transforming an upper surface of a silicon wafer, at least at one selected location, into porous silicon.

25. The method of claim 19, wherein the second semiconductor layer is formed by epitaxial growth.

26. The method of claim 19 further comprising, prior to forming the second semiconductor layer, removing at least some of the non-native insulator to expose at least one portion of the first porous semiconductor layer.

27. The method of claim 19, wherein the non-native insulator comprises at least one material different from an oxide of the first porous semiconductor layer.

* * * * *